US008456189B2

(12) United States Patent  
Lung et al.

(10) Patent No.: US 8,456,189 B2  
(45) Date of Patent: Jun. 4, 2013

(54) DIFFERENTIAL SIGNAL TERMINATION CIRCUIT

(75) Inventors: Joseph Lung, Kanata (CA); Russ Byers, Manotick (CA); Maamoun Seido, Kanata (CA); Richard Geiss, Kanata (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 13/314,767

(22) Filed: Dec. 8, 2011

(65) Prior Publication Data

US 2012/0146689 A1   Jun. 14, 2012

(30) Foreign Application Priority Data

Dec. 10, 2010   (GB) .................................. 1020997.1

(51) Int. Cl.
  *H03K 17/16* (2006.01)
  *H03K 19/003* (2006.01)
  *H03K 19/0175* (2006.01)
  *H03K 3/00* (2006.01)
  *H03B 1/00* (2006.01)

(52) U.S. Cl.
  USPC ............................... 326/30; 326/82; 327/108

(58) Field of Classification Search
  USPC ............. 326/30, 68, 82, 83, 86, 87; 327/108, 327/109, 170, 172–176
  See application file for complete search history.

(56) References Cited

U.S. PATENT DOCUMENTS

| 5,955,911 | A  | * | 9/1999  | Drost et al. ................... 327/404 |
| 6,362,644 | B1 |   | 3/2002  | Jeffery et al. |
| 6,448,815 | B1 | * | 9/2002  | Talbot et al. .................... 326/86 |
| 6,670,828 | B2 |   | 12/2003 | Ramaswamy |
| 6,856,169 | B2 |   | 2/2005  | Frans et al. |
| 6,864,704 | B1 | * | 3/2005  | Wong et al. ..................... 326/26 |
| 6,924,659 | B1 |   | 8/2005  | Andrews et al. |
| 6,972,588 | B1 | * | 12/2005 | Wong et al. ..................... 326/26 |
| 7,162,375 | B2 | * | 1/2007  | Van Epps et al. ............... 702/57 |
| 7,164,995 | B2 | * | 1/2007  | Pollock et al. .................. 702/57 |
| 7,262,630 | B1 |   | 8/2007  | Andrews et al. |
| 7,280,590 | B1 |   | 10/2007 | Boecker et al. |
| 7,315,182 | B2 | * | 1/2008  | Payne et al. ..................... 326/22 |
| 7,843,212 | B2 | * | 11/2010 | Tanaka ............................ 326/30 |
| 8,072,235 | B2 | * | 12/2011 | Nguyen .......................... 326/30 |
| 2002/0130680 | A1 |   | 9/2002 | Meyer et al. |
| 2008/0240739 | A1 | * | 10/2008 | Tanaka .......................... 398/202 |
| 2008/0284465 | A1 |   | 11/2008 | Kao |

FOREIGN PATENT DOCUMENTS

GB         2471542 A       1/2011

* cited by examiner

*Primary Examiner* — Shawki Ismail  
*Assistant Examiner* — Dylan White  
(74) *Attorney, Agent, or Firm* — Marks & Clerk; Richard J. Mitchell

(57) ABSTRACT

A multi-mode differential termination circuit has a pair of differential input terminals for receiving external differential signals, a pair of series-connected load elements coupled between said differential input terminals, and an analog interface terminal coupled a common junction point of said load elements. A bias circuit is coupled to the common junction point of the load elements for selectively applying a bias voltage thereto in response to a digital control signal. A control input receives the digital control signal to activate the bias circuit.

20 Claims, 6 Drawing Sheets

DIFFERENTIAL SIGNAL TERMINATION CIRCUIT

FIELD OF THE INVENTION

This invention relates to the field of signal processing, and in particular to a multi-mode differential termination circuit.

BACKGROUND OF THE INVENTION

LVDS and LVPECL are industry standards for differential high-speed signal interconnection on printed circuit boards. Each has its own specifications for termination at the receiver.

The Low Voltage Differential Signalling (LVDS) standard is defined in the document ANSI/TIA/EIA-644-A.

Low Voltage Positive Emitter Coupled Logic (LVPECL) is a de facto industry standard developed by Motorola and derived from earlier signaling schemes ECL and PECL.

An integrated circuit receiver device may embed differential signal terminations within its circuitry for the purpose of providing a more highly integrated, flexible and efficient circuit solution to the user.

LVDS is a differential signaling scheme in which each side of the output differential pair alternates as the source and the sink of current to the output. Its operating differential current ranges from 2.5 mA to 4.5 mA, which translates into a differential voltage swing of 250 mV to 450 mV when a transmission line pair is end-terminated differentially with a 100 ohm resistor as shown in FIG. 1. No external path to ground is required to terminate a direct-coupled LVDS signal. The common mode voltage is nominally 1.0V.

The LVPECL output structure is characterized by a pair of bipolar transistor open emitters, which alternately switch between on and off states. In order for current to flow from the emitters to ground, external circuit pathways must be provided. At the receiver, the required differential voltage swing is 1.1V, with a DC bias of Vdd-1.3V.

FIG. 2 shows a typical 3.3V LVPECL interconnection circuit with standard termination. The reference voltage Vtt may be implemented as an actual voltage supply, or as equivalent arrangements of resistors referenced to Vdd and ground.

It will be appreciated that these termination circuits are significantly different, yet it would be desirable to provide an on-chip termination circuit solution, where a single integrated circuit is able to cope with both types of signal.

U.S. Pat. No. 6,362,644 discloses a programmable termination circuit, which requires the application of external bias voltages.

SUMMARY OF THE INVENTION

Embodiments of the present invention provide a circuit for terminating both LVDS and PECL signals within the same integrated receiver interface of a CMOS device.

According to one aspect of the present invention there is provided a multi-mode differential termination circuit, comprising a pair of differential input terminals for receiving external differential signals; a pair of series-connected load elements coupled between said differential input terminals; an analog interface terminal coupled a common junction point of said load elements; a bias circuit coupled to the common junction point of said load elements for selectively applying a bias voltage thereto in response to a digital control signal; and a control input for receiving the digital control signal to activate the bias circuit.

The circuit can be programmed to operate in various modes by selecting the condition of the analog and digital inputs: DC coupled PECL mode, AC coupled PECL mode, DC coupled LVDS mode, and AC coupled LVDS mode.

The termination circuit may be implemented in a CMOS process, which satisfies the signal termination (DC bias and impedance match) requirements of both VDS and PECL.

An advantage of this application of CMOS technology is that logic is used to enable and disable analog parts of the circuit without introducing current leakage in the 'off' state.

The applicability of the design may be adapted to other signaling standards as well, so long as the input signal voltage range does not exceed the limits of the connected receiver pads.

According to another aspect of the invention there is provided a method of terminating a differential signal, comprising applying the differential signal to a pair of differential input terminals having a pair of series-connected load elements coupled between said them; and determining the mode of operation by setting an analog condition of an analog interface terminal coupled a common junction point of said load elements and a digital condition of a control input for activating a bias circuit coupled to the common junction point of said load elements.

BRIEF DESCRIPTION OF THE DRAWINGS

The invention will now be described in more detail, by way of example only, with reference to the accompanying drawings, in which:—

DETAILED DESCRIPTION OF EMBODIMENTS OF THE INVENTION

Figure 1:
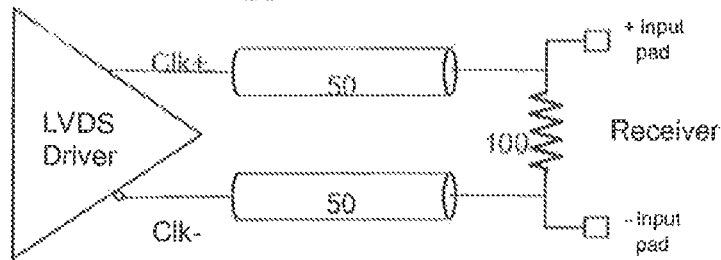
FIG. 1 illustrates a prior art LVDS termination circuit.
Figure 2:
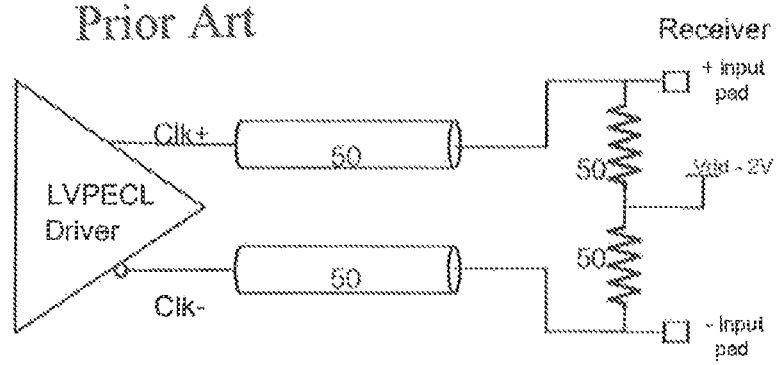
FIG. 2 illustrates a prior art LCPECL termination circuit.
Figure 3:
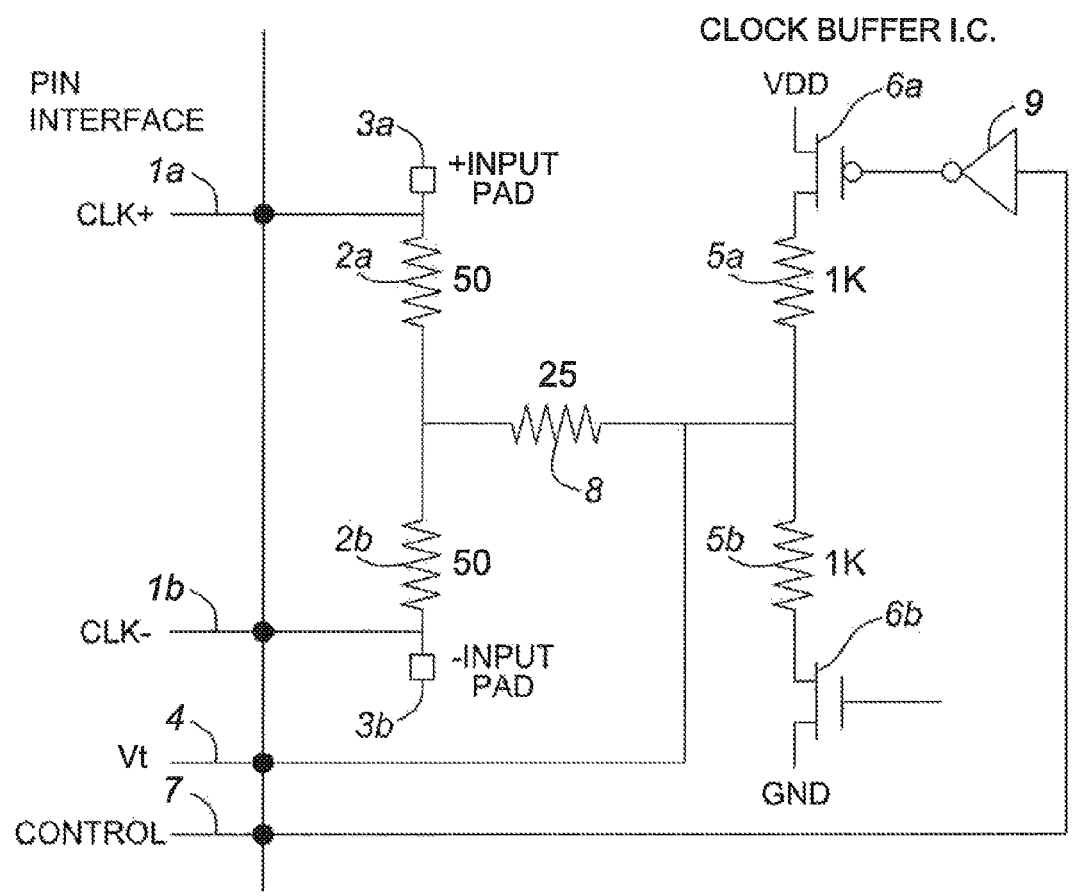
FIG. 3 illustrates a termination circuit in accordance with one embodiment of the invention.

FIG. 3 shows an internal integrated circuit termination and biasing circuit along with the required interface pins in accordance with one embodiment of the invention.

The circuit terminates 50 ohm differential external signal lines 1a, 1b, which are connected to input pads 3a, 3b. A pair of 50 ohm load resistors 2a, 2b are connected in series between the inputs pads 3a, 3b to terminate the signal lines 1a, 1b. The common junction point of the resistors 2a, 2b is connected through a 25 ohm resistor 8 to analog input terminal 4, designated Vt.

An internal bias circuit comprises a pair of 1 Kohm resistors 5a, 5b configured as a voltage divider and connected to the supply rails VDD and GND by respective CMOS transistors 6a, 6b. Transistor 6a in this example is an NMOS transistor and transistor 6b is a PMOS transistor.

The gates of the transistors 6a, 6b are coupled to control pin 7, in the case of transistor 6a through buffer amplifier 9. In the default configuration, this is low, so the CMOS transistors 6a, 6b are off. An internal pull down resistor (not shown) allows the Control pin to default to its low state. The pair of 1 k ohm resistors 5a, 5b appear as an open circuit to the terminated clock signal.

When the control pin is held high, or at a digital 1 level, the transistors 6a, 6b are turned on, and a voltage equal to VDD/2 is applied to the junction point of transistors 2a, 2b via 25 ohm coupling resistor 7, which has little effect on the voltage applied.

It will be noted that the bias resistors 6a, 6b are at least an order of magnitude greater in value than the load resistors 2a, 2b, which terminate the signal lines.

The described circuit provides a 100 ohm differential termination in CMOS with optional connection to an internal biasing circuit an/or an external biasing/parallel termination circuit.

The analog interface pin 7 Vt allows the 100 ohm internal differential termination to be connected to a voltage reference (bias) and reconfigured as 50 ohms single ended to ground.

The differential clock input is assumed to be routed using 100 ohm differential traces and connects to input pads 3a, 3b Clk+ and Clk−. A hardwired differential termination of 100 (50+50) ohms is the basic impedance matched configuration. DC biasing of the termination is applied, if required, by the optional connection of pin Vt to an external DC voltage source (ie GND), or enabling an internal VDD/2 bias point via a logical pin named Control.

When Control is held in the high ("1") state, the PMOS and NMOS transistor pair turn on, forming connections to GND and VDD respectively. The junction of the 1K ohm resistor pair becomes biased to VDD/2 in this state.

Two input pads 3a, 3b are the connection points to the device's differential receiver input structure (not shown). The receiver parameters are such that it operates with differential and common mode voltages as adapted by the termination.

Various possible termination applications are shown in FIGS. 4 to 7.

Figure 4:
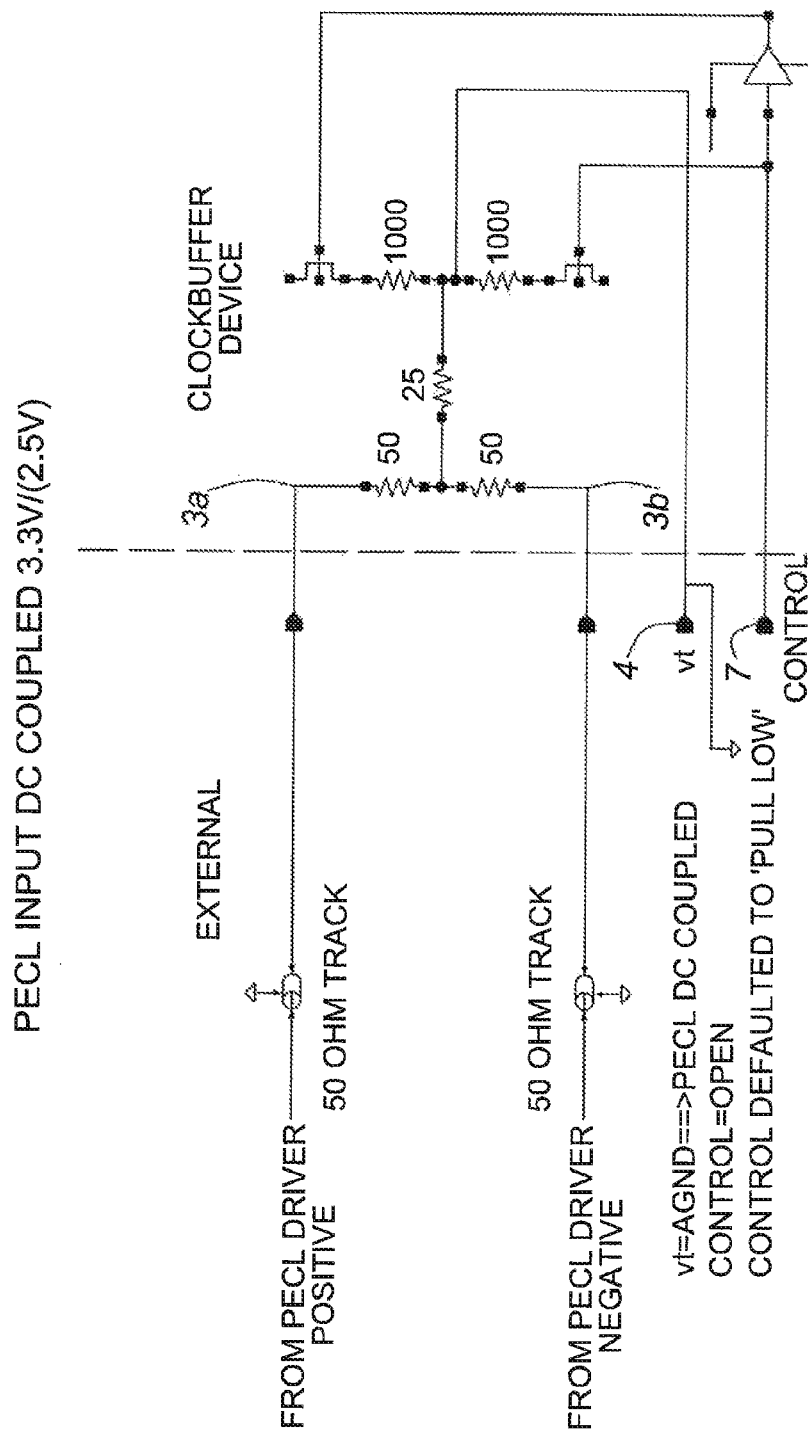
FIG. 4 illustrates a DC coupled PECL termination circuit.

FIG. 4 shows how the design terminates a direct coupled LVPECL interconnect, configured as a parallel style termination. In the configuration shown in FIG. 4, the circuit is configured as a direct coupled LVPECL interconnect in a parallel style termination. In this configuration, the control pin 7 is open, or low, so that the bias circuit is off. The analog pin 4 is connected to ground, and the load resistors 2a, 2b provide the termination, current flowing through the resistor 8 to ground. The resistor 8 has little effect on the voltage.

Figure 5:
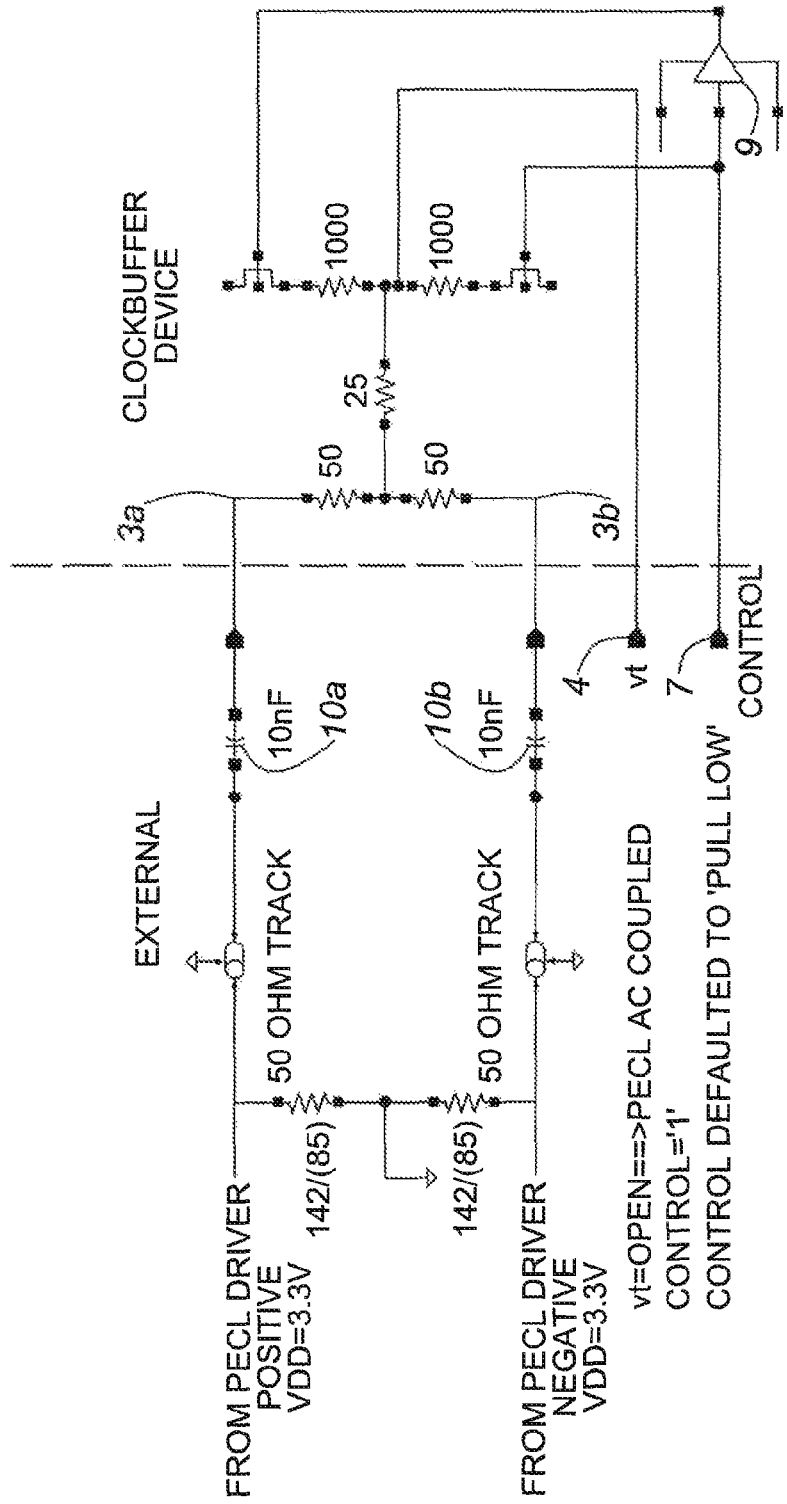
FIG. 5 illustrates an AC coupled PECL termination circuit.

FIG. 5 shows the circuit in an AC coupled LVPECL configuration. In this configuration, the control pin is set high to turn on the bias voltage generated by the voltage divider consisting of 1 Kohm resistors 5a, 5b. The signal lines are connected to the input pads by capacitors 10a, 10b. The circuit thus presents a signal with a DC level of VDD/2.

This model can be extended to other variants of PECL and ECL signal interconnection.

Figure 6:
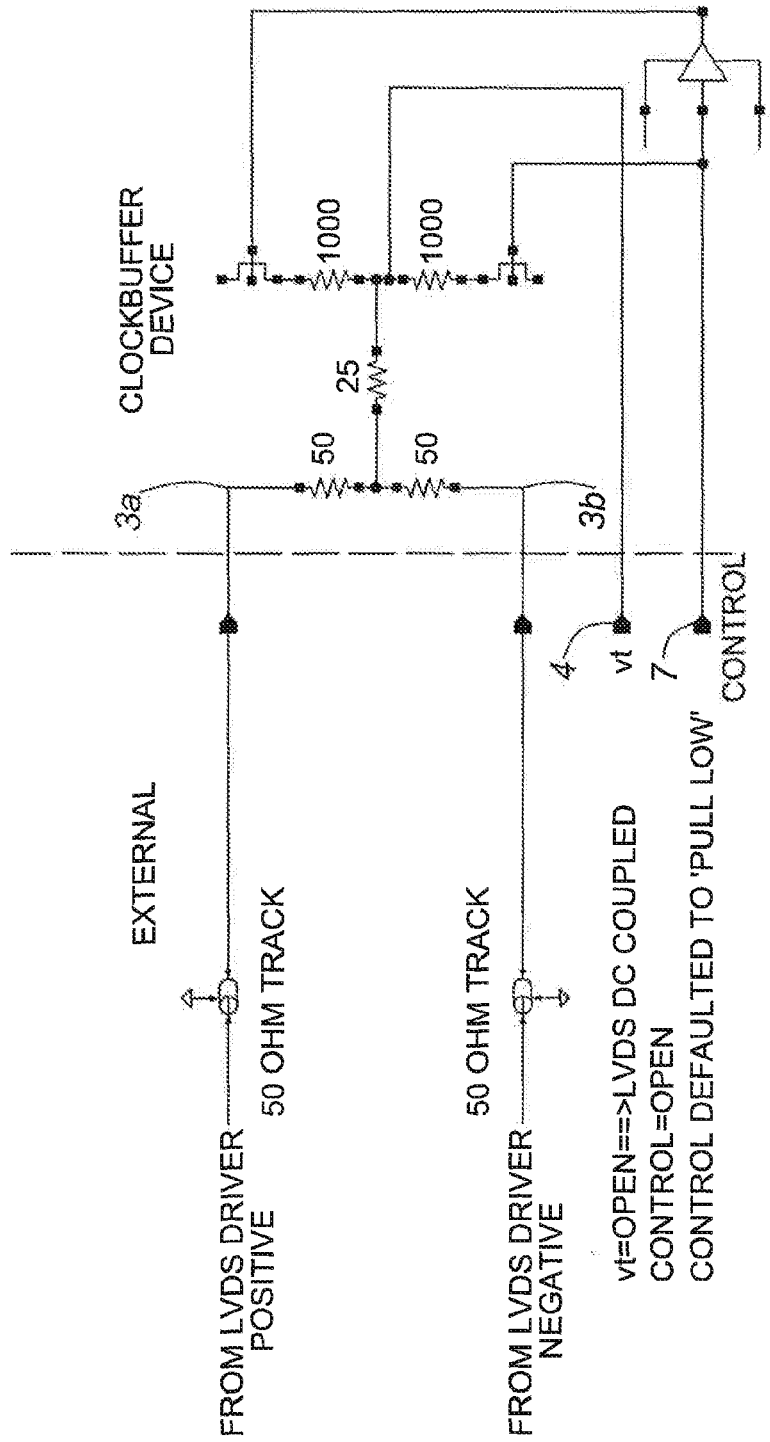
FIG. 6 illustrates a DC coupled LVDS circuit.

FIG. 6 shows the circuit in the direct-coupled LVDS mode. In this mode, the control pin is set high to switch on the bias circuit, and the analog pin is left floating. In this mode the LVDS signal is terminated differentially across the two load resistors 2a, 2b. The circuit is coupled directly to a standard LVDS signal.

Figure 7:
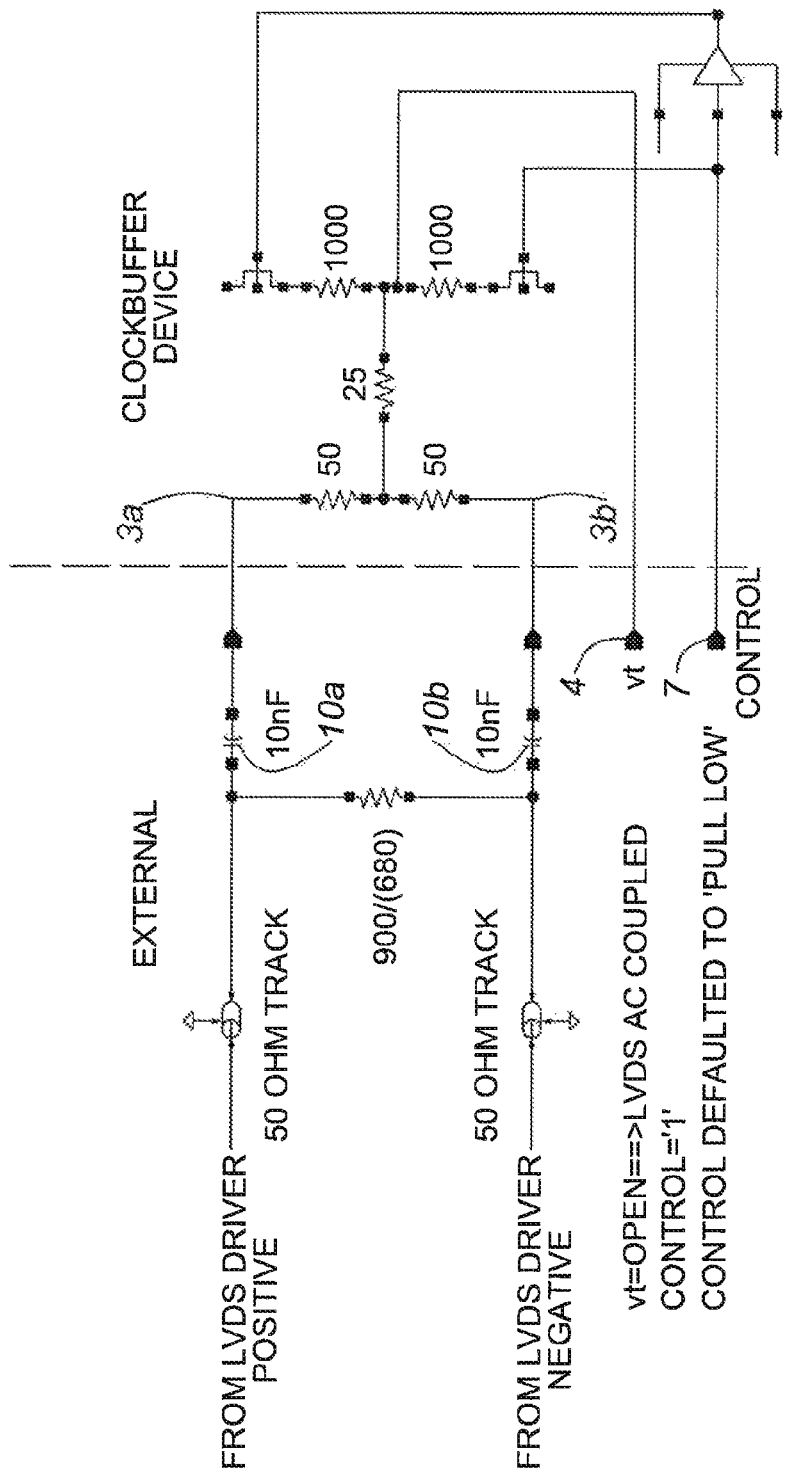
FIG. 7 illustrates an AC coupled LVDS circuit.

FIG. 7 shows an AC coupled LVDS configuration. In this mode, the analog pin is open or left floating and so is the control pin 7, which means the bias circuit is off. In this case the signal lines are connected to the input pads through capacitors 10a, 10b. Again the signal is terminated differentially across the load resistors 2a, 2b.

It will thus be appreciated that embodiments of the invention provide a termination circuit that may be used both in LVPECL and LVDS modes merely by applying a suitable digital control signal to the control pin 7 and an appropriate analog condition, i.e. a voltage, ground or floating, to the analog pin 4. The bias is generated internally. It would also be possible to put a single CMOS switch upstream of the 25 ohm resistor 8, but of course such a configuration would have the disadvantage that the voltage divider of the bias circuit was wasting energy when it was not in use.

The invention claimed is:

1. A multi-mode differential termination circuit, comprising:
   a pair of differential input terminals for receiving external differential signals;
   a pair of series-connected load elements coupled between said differential input terminals;
   an analog interface terminal coupled to a common junction point of said load elements;
   a bias circuit coupled to the common junction point of said load elements for selectively applying a bias voltage thereto in response to a digital control signal; and
   a control input for receiving the digital control signal to activate the bias circuit,
   wherein the bias circuit comprises a pair of series-connected resistive elements, and a pair of digital switches operated by said digital control signal to connect said respective resistive elements to voltage supply rails.

2. A multi-mode differential termination circuit as claimed in claim 1, wherein the digital switches are field effect transistors.

3. A multi-mode differential termination circuit as claimed in claim 2, wherein one of said field effect transistors is an NMOS transistor and the other of said transistors is a PMOS transistor.

4. A multi-mode differential termination circuit as claimed in claim 1, wherein in the default state of the control pin, the digital switches are turned off, and the application of the digital control signal turns the digital switches on.

5. A multi-mode differential termination circuit as claimed in claim 1, wherein the load elements are resistors.

6. A multi-mode differential termination circuit as claimed in claim 1, wherein the control input is connected to one of the digital switches via a buffer amplifier.

7. A multi-mode differential termination circuit as claimed in claim 1, wherein the components of the circuit are integrated onto a single chip.

8. A multi-mode differential termination circuit, comprising:
   a pair of differential input terminals for receiving external differential signals;
   a pair of series-connected load elements coupled between said differential input terminals;
   an analog interface terminal coupled to a common junction point of said load elements;
   a bias circuit coupled to the common junction point of said load elements for selectively applying a bias voltage thereto in response to a digital control signal; and
   a control input for receiving the digital control signal to activate the bias circuit,
   wherein the analog interface terminal is coupled to the common junction point of said load elements by a resistor.

9. A multi-mode differential termination circuit as claimed in claim 8, wherein the bias circuit is coupled to the common junction point by said resistor.

10. A method of terminating a differential signal, comprising:
    applying the differential signal to a pair of differential input terminals having a pair of series-connected load elements coupled between them; and
    determining the mode of operation by setting an analog condition of an analog interface terminal coupled to a common junction point of said load elements and a digital condition of a control input for activating a bias circuit coupled to the common junction point of said load elements, wherein the bias circuit comprises a pair of series-connected resistive elements, and the state of a pair of digital switches operative to connect the resistive elements to the respective supply rails is determined by the digital condition of the control input.

11. A method as claimed in claim 10, wherein the digital switches are field effect transistors.

12. A method as claimed in claim 11, wherein one of said field effect transistors is an NMOS transistor and the other of said transistors is a P MOS transistor.

13. A method as claimed in claim 10, wherein in the default state, the digital switches are turned off, and the application of the digital control signal to the control pin turns the digital switches on.

14. A method as claimed in claim 10, wherein the load elements are resistors.

15. A method as claimed in claim 10, wherein in a direct coupled PECL mode, the analog interface terminal is connected to ground and the control input is configured to inactivate the bias circuit.

16. A method as claimed in claim 10, wherein in an AC coupled PECL mode, analog interface terminal is open and the control input is configured to activate the bias circuit, and the control signals are applied to the input terminals via capacitors.

17. A method as claimed in claim 10, wherein in a direct coupled LVDS mode, the analog interface terminal is open and the control input is configured to inactivate the bias circuit.

18. A method as claimed in claim 10, wherein in an AC coupled LVDS mode, the analog interface terminal is open and the control input is configured to activate the bias circuit.

19. A method of terminating a differential signal, comprising:
- applying the differential signal to a pair of differential input terminals having a pair of series-connected load elements coupled between said them; and
- determining the mode of operation by setting an analog condition of an analog interface terminal coupled to a common junction point of said load elements and a digital condition of a control input for activating a bias circuit coupled to the common junction point of said load elements,
- wherein the analog interface terminal is coupled to the common junction point of said load elements by a resistor.

20. A method as claimed in claim 19, wherein the bias circuit is coupled to the common junction point by said resistor.

* * * * *